(12) United States Patent
Pickard

(10) Patent No.: US 8,604,684 B2
(45) Date of Patent: Dec. 10, 2013

(54) UV STABLE OPTICAL ELEMENT AND LED LAMP USING SAME

(75) Inventor: Paul Kenneth Pickard, Morrisville, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/108,115

(22) Filed: May 16, 2011

(65) Prior Publication Data

US 2012/0293062 A1    Nov. 22, 2012

(51) Int. Cl.
| | |
|---|---|
| *H01J 1/62* | (2006.01) |
| *H05K 13/00* | (2006.01) |
| *G02B 27/00* | (2006.01) |
| *H01J 5/48* | (2006.01) |
| *H01K 1/26* | (2006.01) |

(52) U.S. Cl.
USPC ...... 313/483; 313/318.12; 313/116; 359/350; 29/592.1

(58) Field of Classification Search
CPC .......... H01L 27/1214; H01L 27/1225; G09G 2300/023; G09G 3/3426
USPC .............. 313/483–498, 500–512; 257/40, 59; 445/23, 24, 58
See application file for complete search history.

(56) References Cited

U.S. PATENT DOCUMENTS

| | | | |
|---|---|---|---|
| 6,350,041 B1 | 2/2002 | Tarsa et al. | |
| 6,827,458 B2 * | 12/2004 | Suga | 362/609 |
| 7,029,935 B2 | 4/2006 | Negley et al. | |
| 7,614,759 B2 | 11/2009 | Negley | |
| 7,828,459 B2 * | 11/2010 | Rains | 362/231 |
| 7,842,960 B2 * | 11/2010 | Reginelli et al. | 257/98 |
| 7,872,273 B2 | 1/2011 | Lin et al. | |
| 2004/0145288 A1 | 7/2004 | Ouderkirk et al. | |
| 2005/0242734 A1 * | 11/2005 | Maxik | 313/634 |
| 2010/0067241 A1 * | 3/2010 | Lapatovich et al. | 362/361 |
| 2010/0115807 A1 * | 5/2010 | Shim et al. | 40/1 |
| 2010/0314985 A1 | 12/2010 | Premysler | |
| 2010/0328925 A1 | 12/2010 | Hoelen et al. | |

(Continued)

FOREIGN PATENT DOCUMENTS

| | | |
|---|---|---|
| EP | 1548851 A2 | 6/2005 |
| EP | 2270100 A1 | 1/2011 |
| EP | 2309168 A1 | 4/2011 |
| WO | 2009104136 A1 | 8/2009 |

OTHER PUBLICATIONS

U.S. Appl. No. 12/889,719, filed Sep. 24, 2010.
U.S. Appl. No. 12/975,820, filed Dec. 22, 2010.

(Continued)

*Primary Examiner* — Tracie Y Green
(74) *Attorney, Agent, or Firm* — Steven B. Phillips; Moore & Van Allen, PLLC

(57) ABSTRACT

A UV stable optical element and an LED lamp using such an element are disclosed. Embodiments of the invention include an optical element made at least in part from an inherently UV stable polyester, so that consumable UV-stabilizing additives are not needed. Thus, the substrate of the optical element can maintain transparency and other desirable characteristics over longer periods of time in the face of high ultraviolet light exposure. In some embodiments, the optical element includes the inherently UV stable polyester and a phosphor for remote wavelength conversion. In some embodiments, the UV stable polyester is an aromatic polyester such as polyarylate. The optical element according to example embodiments of the invention can be used in an LED lamp.

11 Claims, 4 Drawing Sheets

(56) References Cited

U.S. PATENT DOCUMENTS

| | | | |
|---|---|---|---|
| 2011/0001422 A1* | 1/2011 | Aanegola et al. | 313/501 |
| 2011/0080740 A1* | 4/2011 | Allen et al. | 362/294 |
| 2011/0092662 A1* | 4/2011 | Tabata et al. | 528/190 |
| 2011/0193473 A1* | 8/2011 | Sanders et al. | 313/483 |

OTHER PUBLICATIONS

Cree, Inc., International Patent Application No. PCT/US2012/037194, International Search Report and Written Opinion, Sep. 17, 2012.

* cited by examiner

UV STABLE OPTICAL ELEMENT AND LED LAMP USING SAME

BACKGROUND

Light emitting diode (LED) lighting systems are becoming more prevalent as replacements for existing lighting systems. LEDs are an example of solid state lighting (SSL) and have advantages over traditional lighting solutions such as incandescent and fluorescent lighting because they use less energy, are more durable, operate longer, can be combined in red-blue-green arrays that can be controlled to deliver virtually any color light, and generally contain no lead or mercury. In many applications, one or more LED dies (or chips) are mounted within an LED package or on an LED module, which may make up part of a lighting unit, lamp, "light bulb" or more simply a "bulb," which includes one or more power supplies to power the LEDs. An LED bulb may be made with a form factor that allows it to replace a standard threaded incandescent bulb, or any of various types of fluorescent lamps. LEDs can also be used in place of florescent lights as backlights for displays.

Translucent or transparent rigid materials may be used with LED lighting to provide diffusion, color mixing, to otherwise direct the light, to serve as an enclosure to protect the LEDs and/or other electronic components, or to provide a support for wavelength conversion material sometimes used to achieve accurate color. Wavelength conversion materials may produce white light when struck by light of a specified color, or may produce an additional color of light that mixes with other colors of light to produce white light, or another specific desired color of light. As an example, phosphor particles can be used as a wavelength conversion material. Phosphor absorbs light at one wavelength and reemits light at a different wavelength. Typically, phosphor particles are randomly distributed within a matrix of encapsulant material. The term phosphor can refer to materials that are sometimes also referred to as fluorescent and/or phosphorescent.

To be used as part of an LED lamp or LED lighting system, phosphor is often applied to or included in a transparent or translucent carrier or substrate. Thus, materials such as acrylic, glass or polycarbonate are often used in LED lighting systems as optical elements, both with and without phosphors. In lighting systems where the LEDs emit ultraviolet (UV) light, consumable UV-stabilizing additives are used in acrylic or polycarbonate substrates so that the material maintains its clarity and strength over time despite the UV exposure. Even in LED systems that generate small amounts of actual UV light, near UV light that may be emitted can be almost as damaging to polymers as UV light. For example, GaN LEDs emit vanishingly small amounts of actual UV light, but large amounts of deep blue, near UV light that can have the same effects as UV light on acrylic or polycarbonate substrates.

SUMMARY

Embodiments of the invention include an optical element made from an inherently UV stable polyester, so that consumable UV-stabilizing additives are not needed. Thus, the rigid form of the optical element of embodiments of the invention can maintain its transparency over longer periods of time in the face of high levels of UV or near UV light as compared to materials requiring additives typically used to stabilize polymers against UV exposure. Such additives are consumable and thus disappear from the material over time. In addition, the substrate material in at least some embodiments of the invention exhibits good mechanical temperature stability, high transmissivity, good flame barrier characteristics, and is capable of achieving varied geometries with tight mechanical tolerances.

In some embodiments, an optical element for an LED lighting system includes a form made from inherently UV stable polyester. The form is shaped to receive at least some light from an LED or LEDs. The form can serve as a carrier or substrate for an appropriate phosphor to be used for remote wavelength conversion. The phosphor is distributed to be coincident with the form, possibly in an applied encapsulant or in the material itself, to provide the wavelength conversion.

In some embodiments, the inherently UV stable polyester further comprises aromatic polyester. In some embodiments, the aromatic polyester is polyarylate. The phosphor can be included by applying an encapsulant containing the phosphor the surface of the form. Alternatively, the phosphor can be disbursed within the form. The substrate carrier form can also in some embodiments be molded to include a cavity, and the cavity can be filled with an encapsulant containing the phosphor.

An optical element according to example embodiments of the invention can be used in an LED lamp. Such an LED lamp can be assembled from the form with or without the phosphor added as previously described. A power supply is provided within the lamp housing and the power supply is electrically connected to an LED assembly including one or more LEDs. The optical element is attached to the housing as appropriate so that the phosphor receives light from the LED assembly and provides remote wavelength conversion.

In some embodiments, the form is dome shaped. The form may be the only optical element of an LED lamp. Alternatively, an LED lamp may be constructed that uses one optical element primarily for remote wavelength conversion, while using a second optical element for other purposes such as diffusion, color mixing, or the like. In the latter case, either or both optical elements may be a rigid form made of the UV stable polyester described herein.

DETAILED DESCRIPTION

Figure 1:
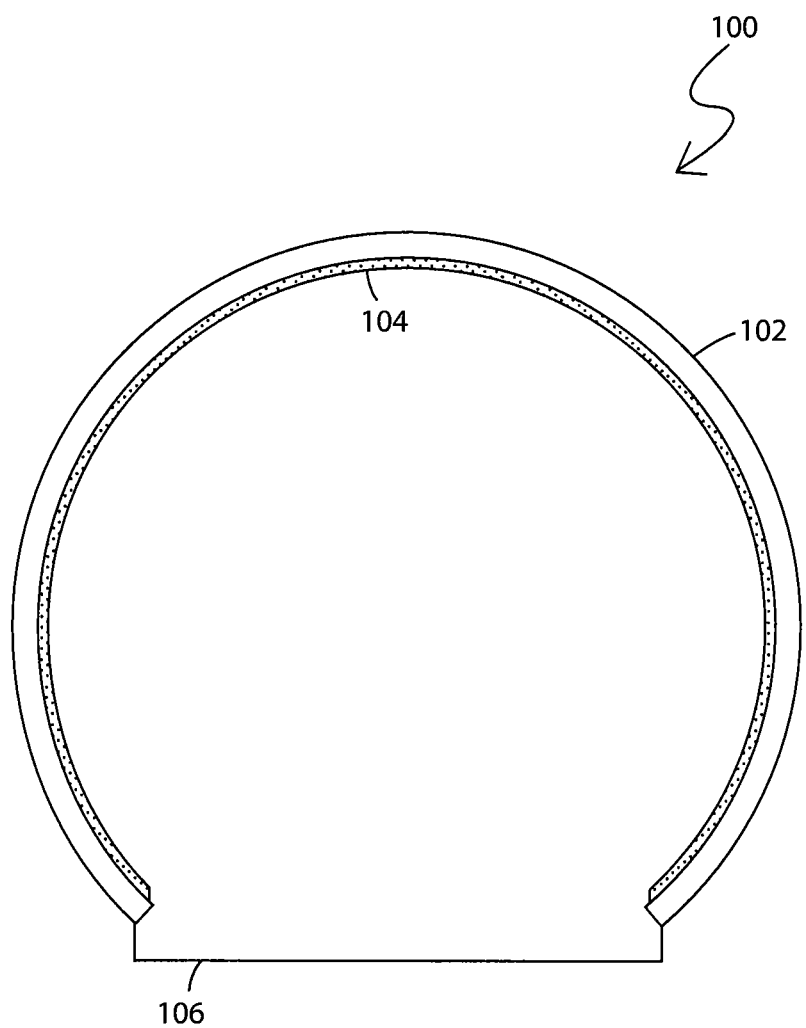
FIG. 1 is a cross-sectional view of an optical element according to an example embodiment of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

FIG. 1 is a cross-sectional view of an optical element according to some embodiments of the invention. Optical element 100 includes a dome-shaped form 102, made of inherently UV stable polyester. In this example embodiment, the UV stable polyester is polyarylate, an aromatic polyester and the dome-shaped form is substantially rigid. Phosphor layer 104 is optionally applied to the rigid form and includes an encapsulant with phosphor particles disbursed therein so that the phosphor particles are coincident with the rigid form and distributed to provide remote wavelength conversion. In use, optical element 100 is mounted as part of a lamp so that an LED assembly resides at, just inside, or near the opening 106. The thickness of the optional phosphor layer in FIG. 1 as well as the thicknesses and sizes of other portions of all the drawings herein may be exaggerated for clarity. Such features are not necessarily shown to scale in any of the drawings.

Figure 2:
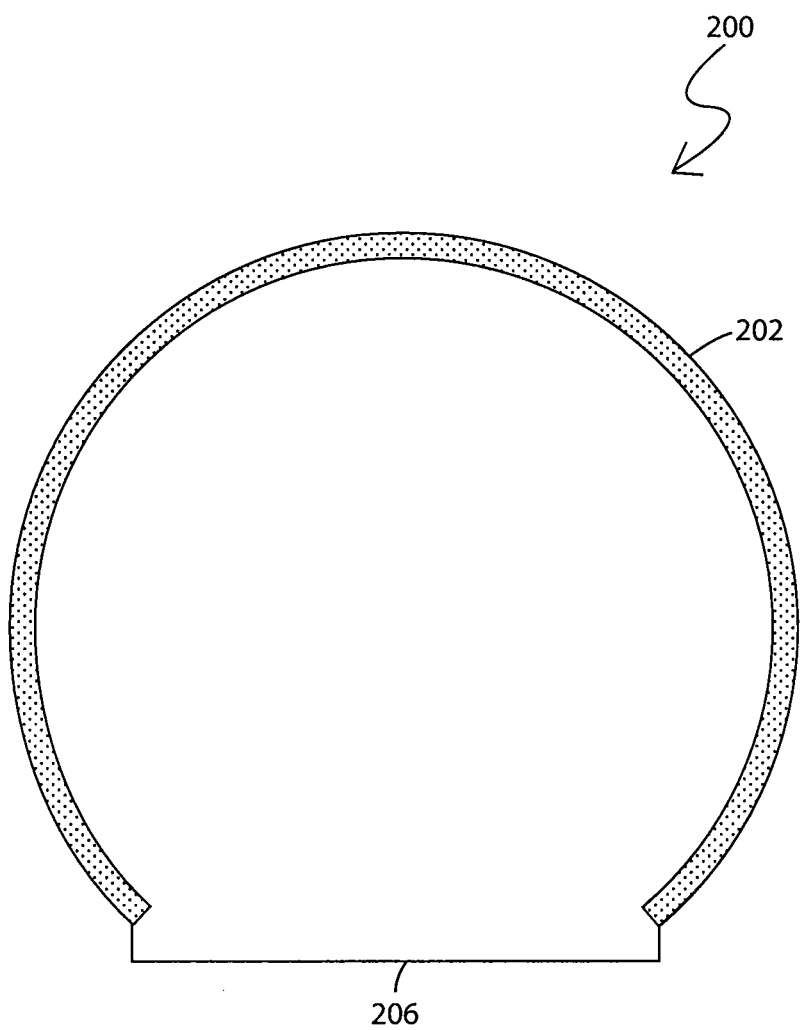
FIG. 2 is a cross-sectional view of an optical element according to another example embodiment of the present invention.

FIG. 2 is a cross-sectional view of an optical element according to additional embodiments of the invention. Optical element 200 includes a rigid, dome shaped form 202, made of inherently UV stable polyester. The UV stable polyester is polyarylate, an aromatic polyester. In this example embodiment, phosphor particles were added to the polyarylate either before or during the process of molding the polyarylate into rigid form 202, so that the phosphor particles are disbursed within the dome shaped rigid form. In use, optical element 200 is mounted as part of a lamp so that an LED assembly resides at, just inside, or near the opening 206.

Figure 3:
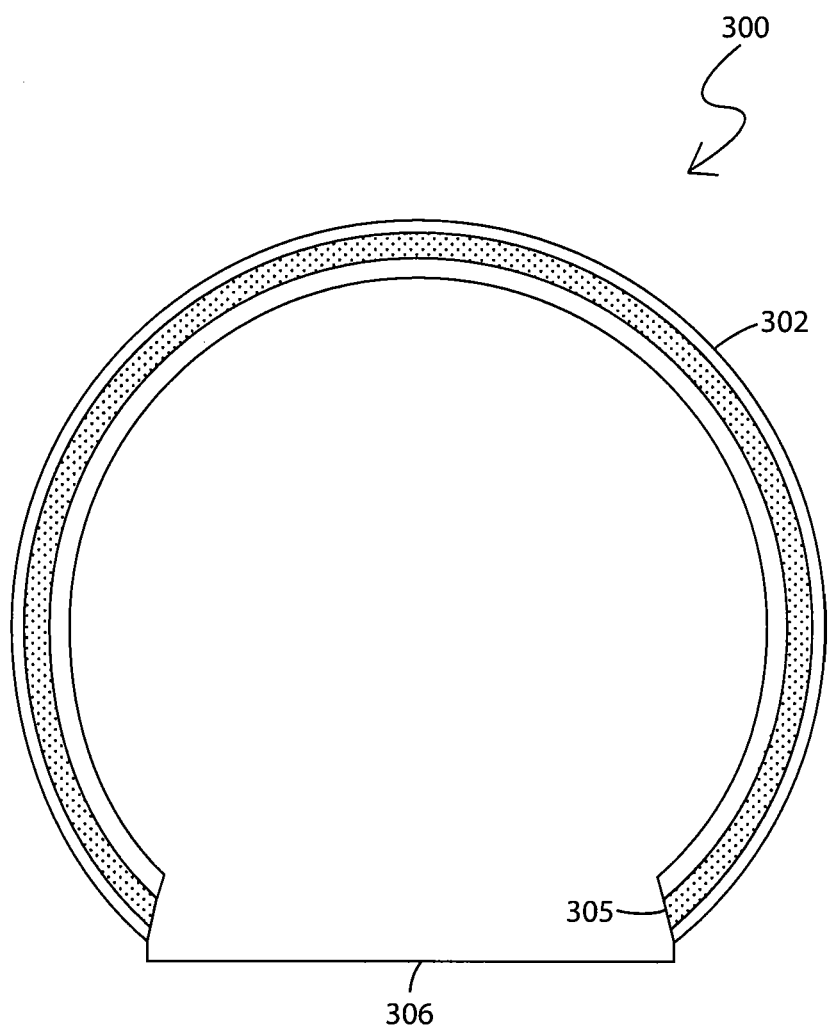
FIG. 3 is a cross-sectional view of an optical element according to an additional example embodiment of the present invention.

FIG. 3 is a cross-sectional view of an optical element according to other embodiments of the invention. Optical element 300 includes a rigid, dome-shaped form 302, made of inherently UV stable polyester. In this example embodiment again, the UV stable polyester is polyarylate. Phosphor disbursed within an encapsulant in this embodiment resides in a cavity 305 in the dome-shaped wall of the rigid form 302. Since cavity 305 is coincident with the entire spherical shape of the dome, the phosphor is coincident with the rigid form and distributed to provide remote wavelength conversion. In use, optical element 300 is again mounted as part of a lamp so that an LED assembly resides at, just inside, or near the opening 306.

Figure 4:
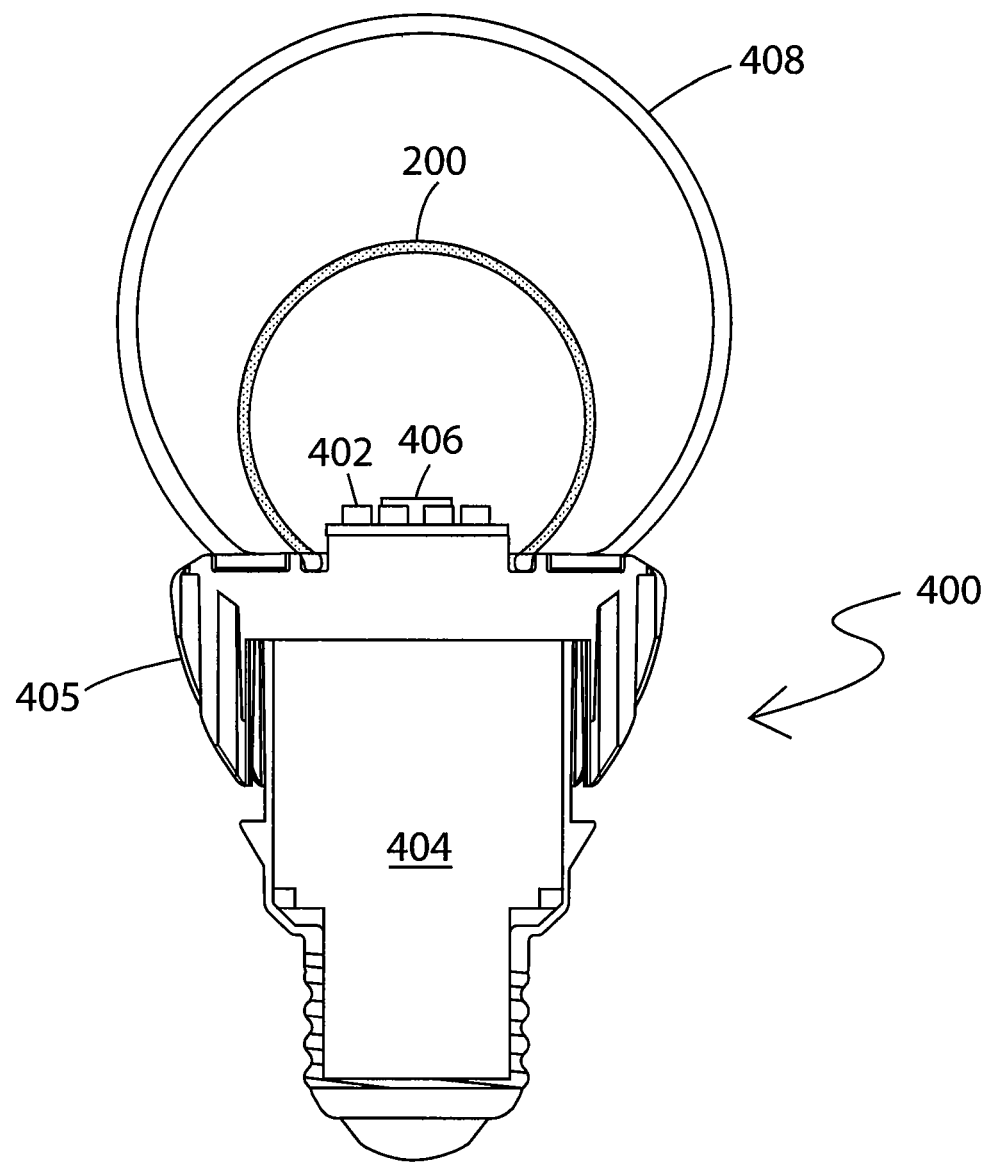
FIG. 4 is a cross-sectional view of an LED lamp according to example embodiments of the present invention.

FIG. 4 is a cross-sectional view of a finished LED lamp making use of example embodiments of the present invention. Lamp 400 of FIG. 4 includes an LED assembly including a plurality of LEDs 402 and power supply 404. The power supply is conventional in nature and so details are not shown. Cooling for both the LED assembly and power supply 404 is enhanced by heatsink 405. Bolt 406 holds the LED assembly and heatsink together. Only the top of the bolt is visible in this view. Lamp 400 includes external optical element 408 to protect some of the other lamp components and provide direction and/or diffusion of the light from the lamp. Thus, in this example, optical element 408 may be referred to as a diffusion element. Optical element 408, in this embodiment, is essentially a light transmissive globe. Optical element 408 can be made of glass or plastic, including the UV stable polyester as discussed herein, or another suitable material.

The various additional portions of the LED lamp 400 according to example embodiments of the invention can be made of any of various materials. The heat sink can be made of metal or plastic, as can the various portions of the housings for the components of the lamp. Plastic with enhanced thermal conductivity can also be used to form the heat sink.

Still referring to FIG. 4, LED lamp 400 includes an internal optical element 200 in accordance with example embodiments of the invention as described above. Optical element 200 is a polyarylate globe rigid form as previously shown in FIG. 2. Polyarylate optical element 200 includes phosphor particles that were added to the polyarylate either before or during the process of molding the polyarylate into its shape so that the phosphor particles are disbursed within the dome shaped rigid form. An internal phosphor carrier like that shown in FIG. 4 can be constructed in any of the ways previously mentioned, or other ways.

A lamp like that shown in FIG. 4 can be made with or without the external optical element 408 depending on what type of light pattern is desired. The lamp can also be made with or without the internal optical element 200. The size of optical element 200 can vary widely. In the example of FIG. 4, both optical elements include a lip that rests in spaces in the top of heatsink 405. The optical elements can then be fastened in place with thermal epoxy. Other fastening methods can be used to fasten an optical element to the other parts of the lamp. As examples, globes can be threaded and can screw into or onto the lamp. A tab-and-slot or similar mechanical arrangement could be used, as could fasteners such as screws or clips.

Blue or violet LEDs can be used in the LED assembly of a lamp and the appropriate phosphor can be used with the carrier described herein and energized to create white light. LED devices can be used with phosphorized coatings packaged locally with the LEDs to create various colors of light which can then energize a remote phosphor on the carrier to create white light. For example, a blue-shifted yellow (BSY) LED device can be used with a red phosphor on or in the carrier to create white light. Example embodiments can produce light with a CRI of at least 70, at least 80, at least 90, or at least 95. By use of the term substantially white light, one could be referring to a chromacity diagram including a blackbody locus of points, where the point for the source falls within four, six or ten MacAdam ellipses of any point in the blackbody locus of points.

A lamp according to embodiments of the invention can be assembled using varied fastening methods and mechanisms for interconnecting the various parts. For example, in some embodiments locking tabs and holes can be used. In some embodiments, combinations of fasteners such as tabs, latches or other suitable fastening arrangements and combinations of fasteners can be used which would not require adhesives or screws. In other embodiments, adhesives, screws, bolts, or other fasteners may be used to fasten together the various components.

Embodiments of the invention use inherently UV stable polyester. By "inherently UV stable" what is meant is that no consumable UV-stabilizing additive is required for UV stability, so that the UV-stability of the material is substantially permanent. The phrase "inherently UV stable" does not necessarily imply that no additives of any kind are used. As previously mentioned, one appropriate inherently UV stable polyester is polyarylate (PAR), CAS Registry No. 26590-50-1. Any other suitable inherently UV stable material may be used. Polyarylate is commercially available from Plastics International, Inc. of Eden Prairie, Minn. in the United States and from Unitika, Ltd. in Uji City, Japan.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. An optical element comprising:
 a form including inherently UV stable polyester, the form maintaining transparency and being shaped to receive at least some light from at least one LED; and
 phosphor disposed in a cavity within a wall of the form to provide remote wavelength conversion for the at least some light received from the at least one LED.

2. The optical element of claim 1 wherein the phosphor is contained within an encapsulant.

3. The optical element of claim 1 wherein the inherently UV stable polyester further comprises aromatic polyester.

4. The optical element of claim 3 wherein the aromatic polyester is polyarylate.

5. An LED lamp comprising:
 an LED assembly;
 an internal optical element comprising inherently UV stable polyester, the internal optical element maintaining transparency and being shaped to receive light from the LED assembly and including phosphor disposed in a cavity within a wall of the internal optical element to provide remote wavelength conversion;
 a diffusion element disposed to emit light from the LED lamp; and
 a power supply electrically connected to the LED assembly.

6. The LED lamp of claim 5 wherein the phosphor is contained within an encapsulant.

7. The LED lamp of claim 5 wherein at least one of the internal optical element and the diffusion element is dome-shaped.

8. The LED lamp of claim 5 wherein the inherently UV stable polyester further comprises aromatic polyester.

9. The LED lamp of claim 8 wherein the aromatic polyester is polyarylate.

10. A method of producing an LED lamp, the method comprising:
 providing a power supply in a housing;
 connecting an LED assembly to the power supply;
 providing an internal optical element comprising polyarylate for maintaining transparency, the internal optical element including phosphor disposed in a cavity within a wall of the internal optical element to provide remote wavelength conversion;
 providing a diffusion element; and
 attaching the internal optical element and the diffusion element to the housing so that the internal optical element receives light from the LED assembly and the diffusion element emits light from the LED lamp.

11. The method of claim 10 further comprising forming at least one of the internal optical element and the diffusion element so as to be dome-shaped.

\* \* \* \* \*